United States Patent
Lee et al.

(10) Patent No.: US 8,492,741 B2
(45) Date of Patent: Jul. 23, 2013

(54) RESISTIVE RANDOM ACCESS MEMORY DEVICE AND MEMORY ARRAY INCLUDING THE SAME

(75) Inventors: Chang-bum Lee, Seoul (KR); Dong-soo Lee, Gunpo-si (KR); Chang-jung Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 291 days.

(21) Appl. No.: 12/805,430

(22) Filed: Jul. 30, 2010

(65) Prior Publication Data

US 2011/0049464 A1    Mar. 3, 2011

(30) Foreign Application Priority Data

Aug. 26, 2009    (KR) .................. 10-2009-0079188

(51) Int. Cl.
*H01L 29/02*    (2006.01)
(52) U.S. Cl.
USPC ..... 257/4; 257/2; 257/3; 257/5; 257/E29.002; 438/102; 438/103; 438/104
(58) Field of Classification Search
USPC .................. 257/2–5, E29.002; 438/102–104
See application file for complete search history.

(56) References Cited

U.S. PATENT DOCUMENTS

| 2007/0120124 A1* | 5/2007 | Chen et al. ................. 257/43 |
| 2007/0126045 A1 | 6/2007 | Choi et al. |
| 2008/0116440 A1 | 5/2008 | Ho et al. |
| 2008/0121864 A1 | 5/2008 | Seo et al. |
| 2008/0164568 A1* | 7/2008 | Lee et al. ................. 257/537 |
| 2008/0219039 A1 | 9/2008 | Kumar et al. |
| 2009/0008620 A1 | 1/2009 | Baek et al. |

FOREIGN PATENT DOCUMENTS

KR    10-2008-0011956    2/2008

* cited by examiner

*Primary Examiner* — Jami M Valentine
(74) *Attorney, Agent, or Firm* — Harness, Dickey & Pierce, P.L.C.

(57) ABSTRACT

A resistive random access memory (RRAM) includes a resistive memory layer of a transition metal oxide, such as Ni oxide, and is doped with a metal material. The RRAM may include at least one first electrode, a resistive memory layer on the at least one first electrode, the resistive memory layer including a Ni oxide layer doped with at least one element selected from a group consisting of Fe, Co, and Sn, and at least one second electrode on the resistive memory layer. The RRAM device may include a plurality of first electrodes and a plurality of second electrodes, and the resistive memory layer may be between the plurality of first electrodes and the plurality of second electrodes.

19 Claims, 13 Drawing Sheets

RESISTIVE RANDOM ACCESS MEMORY DEVICE AND MEMORY ARRAY INCLUDING THE SAME

CROSS-REFERENCE TO RELATED APPLICATIONS

This application claims priority under 35 U.S.C. §119 to Korean Patent Application No. 10-2009-0079188, filed on Aug. 26, 2009, in the Korean Intellectual Property Office (KIPO), the disclosure of which is incorporated herein in its entirety by reference.

BACKGROUND

1. Field

Example embodiments relate to a resistive random access memory (RRAM) device, and particularly, to a RRAM device having improved electrical characteristics obtained by doping a resistive memory layer that stores information, and an RRAM array.

2. Description

A conventional semiconductor memory array includes a plurality of unit memory cells that are electrically connected to one another. In dynamic random access memory (DRAM), for example, a unit memory cell may include one switch and one capacitor. A DRAM has high integration density and high operation speed. However, when power is not supplied to the DRAM, data stored in the DRAM is erased. An example of non-volatile memory is flash memory, in which stored data is not erased when power is not supplied. Although flash memory has non-volatile characteristics, flash memory has low integration density and low operation speed as compared to DRAM.

Non-volatile memory devices such as magnetic random access memory (MRAM), ferroelectric random access memory (FRAM), phase-change random access memory (PRAM), and resistive random access memory (RRAM) are currently being researched.

RRAM is a resistive type of memory based on a characteristic that a resistance of a transition metal oxide varies according to a voltage applied thereto. The RRAM includes a resistive memory layer formed between upper and lower electrodes. The resistive memory layer may include a transition metal oxide and may exhibit a variable resistance characteristic, wherein resistance of the transition metal oxide varies according to a voltage applied thereto.

SUMMARY

According to example embodiments, a resistive random access memory (RRAM) includes at least one first electrode; a resistive memory layer on the at least one first electrode, the resistive memory layer including a Ni oxide layer doped with at least one element selected from a group consisting of Fe, Co, and Sn; and at least one second electrode on the resistive memory layer.

According to example embodiments, a doping concentration of the at least one element selected from the group consisting of Fe, Co, and Sn in the resistive memory layer is between about 3 at % and about 15 at %.

According to example embodiments, the resistive memory layer is doped with Fe.

According to example embodiments, the RRAM device further includes a switch structure on the at least one first electrode; and an intermediate electrode on the switch structure.

According to example embodiments, the resistive memory layer is between a plurality of first electrodes and a plurality of second electrodes.

According to example embodiments, a resistance of the resistive memory layer varies according to a voltage applied thereto.

According to example embodiments, the resistive memory layer exhibits at least two resistance states.

According to example embodiments, a resistive random access memory (RRAM) device includes a first electrode; a switch structure on the first electrode; an intermediate electrode on the switch structure; a resistive memory layer on the intermediate electrode, the resistive memory layer including a Ni oxide layer doped with at least one element selected from a group consisting of Fe, Co, and Sn; and a second electrode on the resistive memory layer.

According to example embodiments, a doping concentration of the at least one element selected from the group consisting of Fe, Co, and Sn in the resistive memory layer is between about 3 at % and about 15 at %.

According to example embodiments, the resistive memory layer is doped with Fe.

According to example embodiments, a resistance of the resistive memory layer varies according to a voltage applied thereto.

According to example embodiments, the resistive memory layer exhibits at least two resistance states.

According to example embodiments, a resistive random access memory (RRAM) array including a plurality of first electrode lines in a first direction; a first switch structure on each of the first electrode lines; a first intermediate electrode on the first switch structure; a first resistive memory layer on the first intermediate electrode, the first resistive memory layer including a Ni oxide layer doped with at least one element selected from a group consisting of Fe, Co, and Sn; and a plurality of second electrode lines on the first resistive memory layer in a second direction, the second direction intersecting the first direction.

According to example embodiments, the RRAM array further includes a second switch structure on the plurality of second electrode lines; a second intermediate electrode on the second switch structure; a second resistive memory layer on the second intermediate electrode, the second resistive memory layer including a Ni oxide doped with at least one element selected from the group consisting of Fe, Co, and Sn; and a plurality of third electrode lines on the second resistive memory layer in the first direction.

According to example embodiments, a doping concentration of the at least one element selected from the group consisting of Fe, Co, and Sn in the first resistive memory layer is between about 3 at % and about 15 at %.

According to example embodiments, the first resistive memory layer is doped with Fe.

According to example embodiments, a resistance of the first resistive memory layer varies according to a voltage applied thereto.

According to example embodiments, the first resistive memory layer exhibits at least two resistance states.

According to example embodiments, a resistance of the second resistive memory layer varies according to a voltage applied thereto.

According to example embodiments, the second resistive memory layer exhibits at least two resistance states.

BRIEF DESCRIPTION OF THE DRAWINGS

The above and other features and advantages will become more apparent by describing in detail example embodiments

DESCRIPTION OF EXAMPLE EMBODIMENTS

Figure 1A:
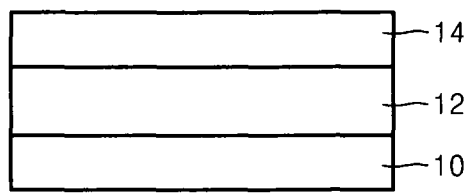
FIGS. 1A and 1B are cross-sectional views of a resistive random access memory (RRAM) device, according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1B:
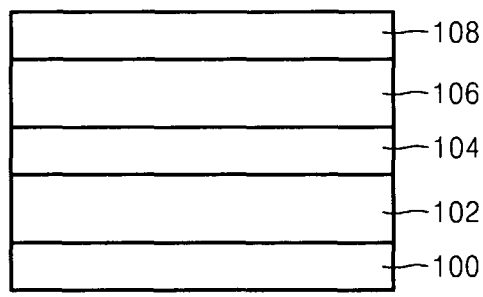

FIGS. 1A and 1B are cross-sectional views of a resistive random access memory (RRAM) device, according example embodiments. Referring to FIG. 1A, a resistive memory layer 12 and a second electrode 14 are sequentially formed on a first electrode 10. Referring to FIG. 1B, a switch structure 102, an intermediate electrode 104, a resistive memory layer 106, and a second electrode 108 are sequentially formed on a first electrode 100. The RRAM device of FIGS. 1A and 1B may have a cross point type multi-array structure. For example, the RRAM device of FIG. 1B may have an array structure wherein the first electrode 100 includes a plurality of electrode lines formed in a first direction, the second electrode 108 is formed to cross the first electrode 100 and includes a plurality of electrode lines, and the switch structure 102, the intermediate electrode 104, and the resistive memory layer 106 are formed at intersections between the first electrode 100 and the second electrode 108.

Materials forming the layers of the RRAM device shown in FIGS. 1A and 1B will now be described below. The first electrodes 10 and 100, the intermediate electrode 104, and/or the second electrodes 14 and 108 may be formed of a conductive material, for example, a metal or a conductive metal oxide. The switch structure 102 may include a diode or a varistor. When the switch structure 102 includes, for example, a diode structure, a silicon diode or oxide diode, in which a first oxide semiconductor and a second oxide semiconductor are stacked, may be used.

The resistive memory layers 12 and 106 may be formed of a material that exhibits a variable resistance characteristic, wherein a resistance of the layer varies according to a voltage applied thereto. For example, the resistive memory layers 12 and 106 may be formed of a transition metal oxide doped with, for example, Fe, Co, and/or Sn. The transition metal oxide may, for example, include a Ni oxide.

The resistive memory layers 12 and 106 will now be described in more detail. Fe, Co, and Sn are more reactive to oxygen than Ni. A Ni oxide layer is formed on an electrode and, when is doped with a small amount of Fe, for example, a portion of the Ni oxide layer reacts with Fe, and thus $Ni^0$ and Fe oxide may be formed. The generation of $Ni^0$ may improve the switching characteristics of the RRAM device. However, a material that is more reactive to oxygen than Fe, Co, and/or Sn may greatly increase the amount of oxide, which may adversely affect the switching characteristics of the RRAM device.

Figure 1C:
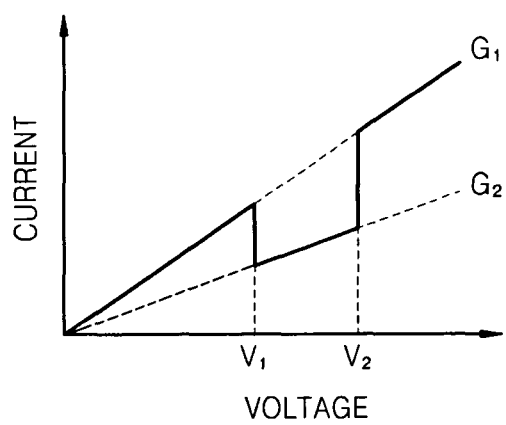
FIG. 1C is a graph illustrating the operational characteristics of an RRAM device, according to example embodiments.

FIG. 1C is a graph illustrating the operational characteristics of a RRAM device according to example embodiments. A horizontal axis (abscissa) indicates an applied voltage, and a vertical axis (ordinate) indicates a current with respect to the applied voltage. Referring to FIG. 1C, as the magnitude of a voltage applied to a resistive memory layer through lower and upper electrodes is gradually increased from 0V, a current through the resistive memory layer increases along a line G1. However, when a voltage greater than $V_1$ is applied, the resistance of the resistive memory layer increases, and thus, the current is reduced (reset). When a voltage between $V_1$ and $V_2$ applied to the resistive memory layer is increased, the current that flows through the resistive memory layer is increased along a line G2. When the voltage $V_2$ is applied to the resistive memory layer, the resistance is reduced (set), and thus, the current follows the line $G_1$.

The electrical characteristics of the RRAM device when a voltage smaller than V1 is applied are different from when a voltage greater than V1 is applied. This will be described below. If a voltage between $V_1$ and $V_2$ is applied to the resistive memory layer and then a voltage smaller than $V_1$ is applied to the resistive memory layer, the current changes along the line G1. Such characteristics may be applied to the resistive memory layer to the RRAM device. For example, by designating a state of the RRAM device as "0" when a voltage between $V_1$ and $V_2$ is applied to the resistive memory layer, and by designating the state of the RRAM device as "1" when a voltage greater than $V_2$ is applied to the resistive memory layer, data may be written accordingly. The data is reproduced by determining whether the RRAM device is in the state of "0" or "1" by applying a voltage smaller than $V_1$ to the resistive memory layer and measuring a drain current Id.

As described above, the RRAM device of example embodiments is based on the characteristics of the transition metal oxide that may exhibit the unipolar characteristics indicating memory switching via a single polarity. Such characteristics are distinguished from a memory device that uses a resistive memory layer having bipolar characteristics.

Figure 2A:
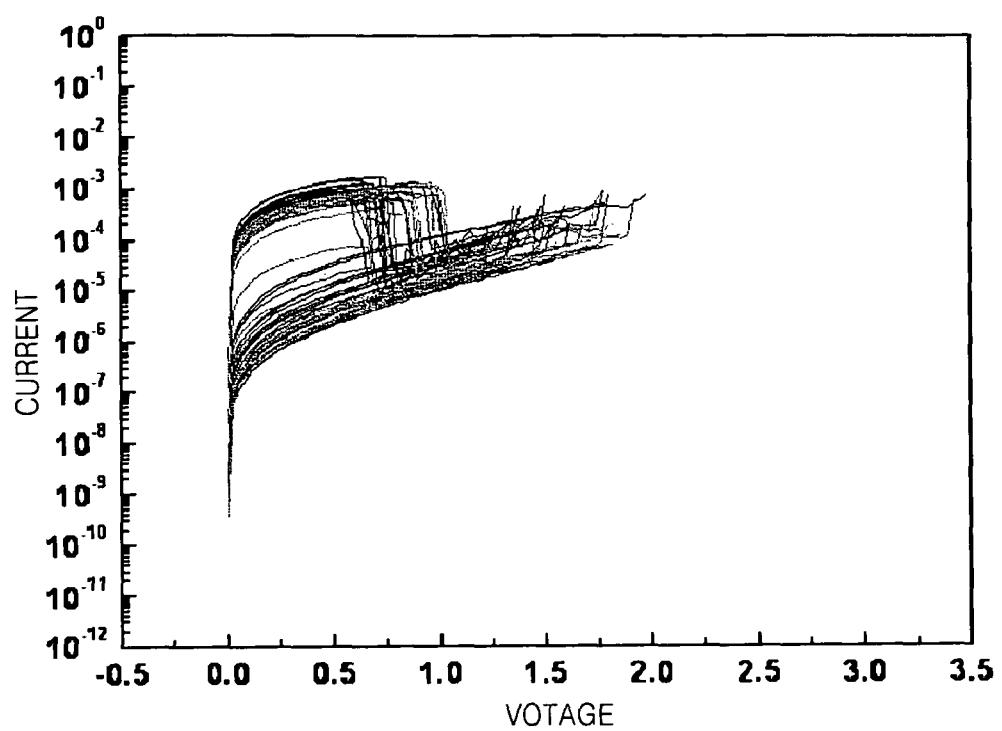
FIG. 2A is a graph illustrating current with respect to a voltage applied to a RRAM device, according to example embodiments.

FIG. 2A is a graph illustrating current with respect to a voltage applied to a RRAM device according to example embodiments. In a specimen for a test, an electrode is formed of Pt having a thickness of 40 nm, a resistive memory layer is formed of Ni oxide, and Fe is doped in the resistive memory layer at 7 at %. The thickness of the resistive memory layer is 15 nm and the width thereof is 500 nm. An upper electrode is formed of a Pt layer on the resistive memory layer having a thickness of 40 nm. The graph shows that the current is reset at a voltage between about 0.5 V and about 1.0 V and is set at a voltage greater than 1.5 V.

Figure 2B:
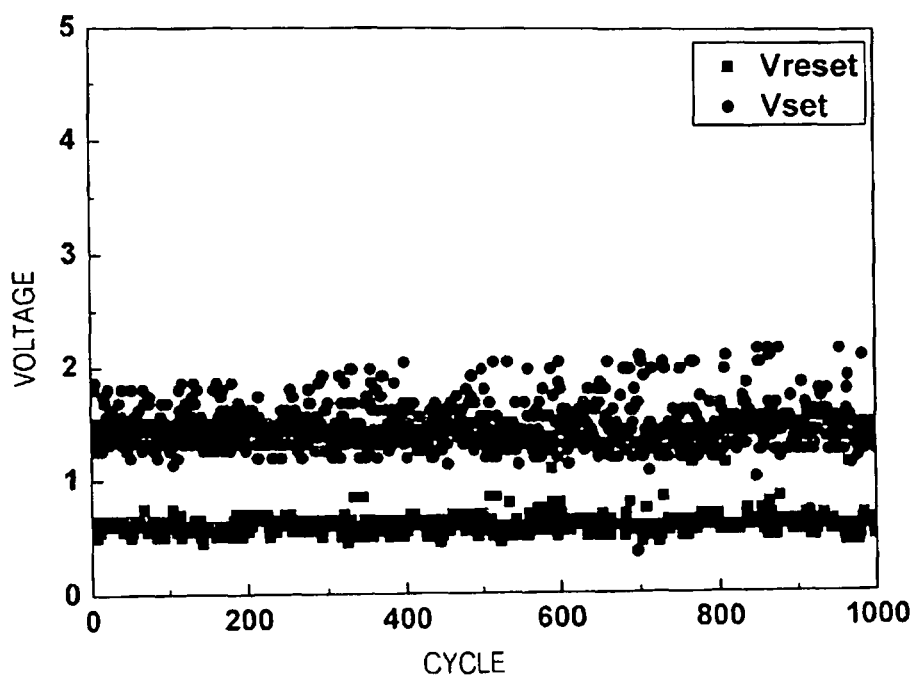
FIGS. 2B and 2C are graphs illustrating distributions of voltages by performing a switching operation 1000 times and measuring the electrical characteristics of an RRAM device, according to example embodiments.
Figure 2C:
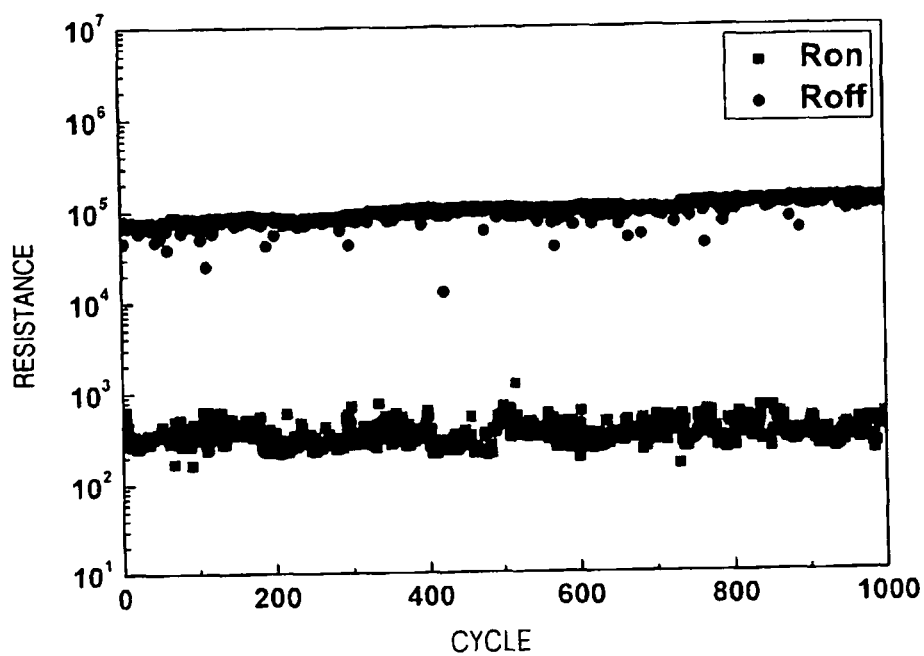

FIGS. 2B and 2C are graphs illustrating distributions of voltages by performing a switching operation a 1000 times and measuring the electrical characteristics of an RRAM device, according to example embodiments. Referring to FIG. 2B, a horizontal axis (abscissa) indicates switching cycles, and a vertical axis (ordinate) indicates a reset and set voltage. Referring to FIG. 2C, a horizontal axis (abscissa) indicates the switching cycles, and a vertical axis (ordinate) indicates a resistance.

Referring to FIGS. 2B and 2C, in a resistive memory layer formed of Fe-doped Ni oxide, the voltage and resistance for each resistance state is different, and the distribution characteristics are stable, as indicated by the 1000 switching operations.

Figure 3:
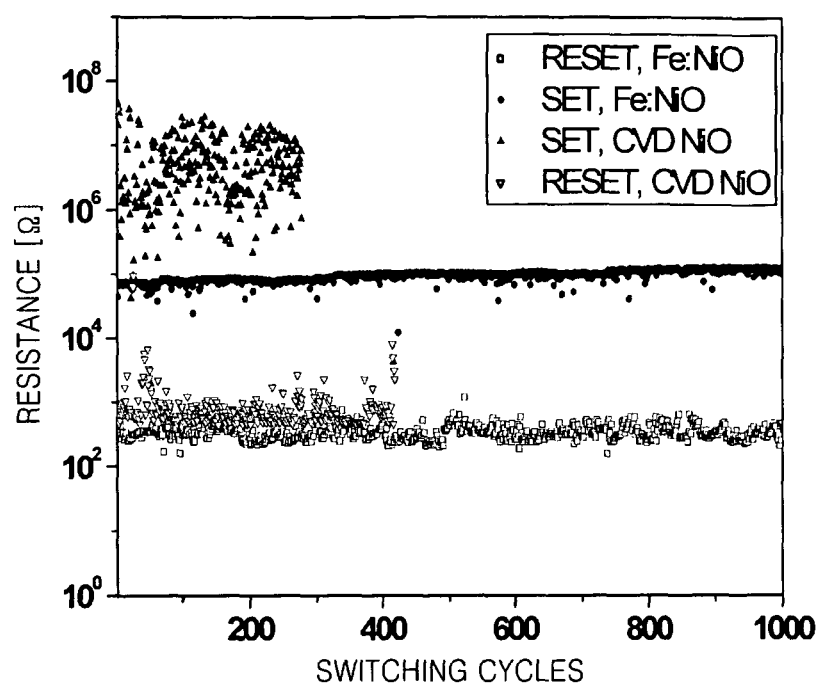
FIG. 3 is a graph illustrating the operational characteristics of a resistive memory layer that is formed of a Fe-doped Ni oxide and a resistive memory layer formed of a Ni oxide that is not doped with Fe, according to example embodiments.

FIG. 3 is a graph illustrating the operational characteristics of a resistive memory layer that is formed of Fe-doped Ni oxide and a resistive memory layer formed of a Ni oxide that is not doped with Fe, according to example embodiments. Referring to FIG. 3, a horizontal axis indicates switching cycles, and a vertical axis indicates resistances in reset and set states. Resistances of the resistive memory layer formed of Ni oxide that is not doped with Fe are identified in the set and reset states. In particular, the resistive memory layer formed of non-Fe doped Ni oxide has a large resistance distribution range in the set state. Meanwhile, a set state of the resistive memory layer formed of the Fe-doped Ni oxide has a narrower distribution and may be referred to as being stabilized, as indicated by a result of performing a switching operation many times.

Figure 4A:
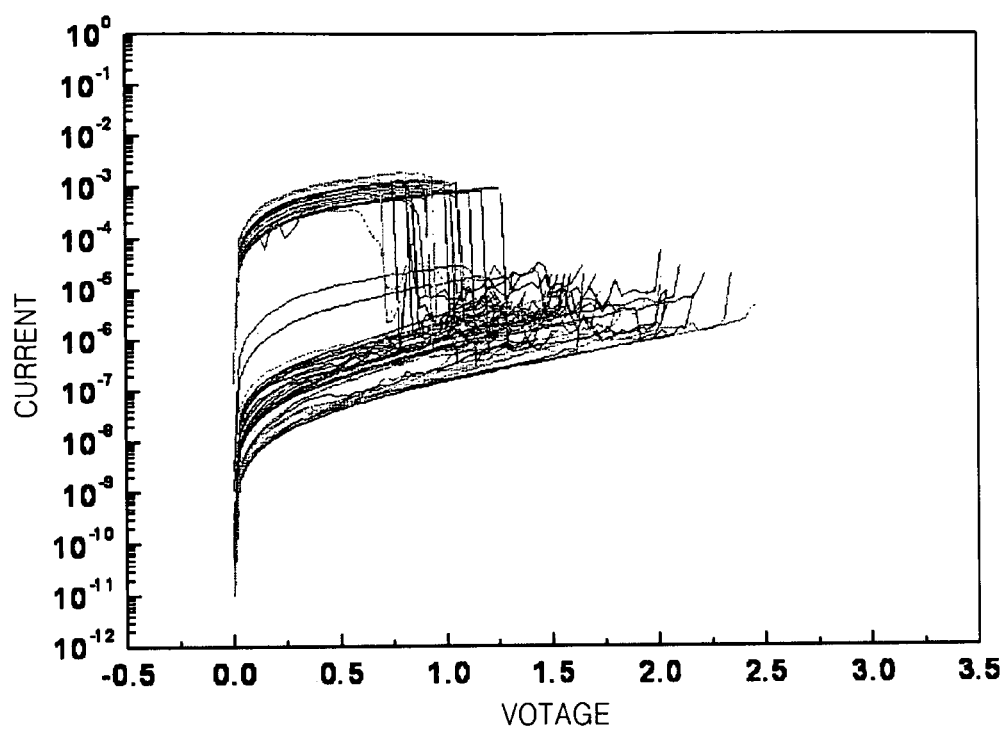
FIGS. 4A and 4B are graphs illustrating the electrical characteristic of RRAM devices that are formed of Ni oxides doped with Fe at 5 at % and 7 at %, respectively, according to example embodiments.
Figure 4B:
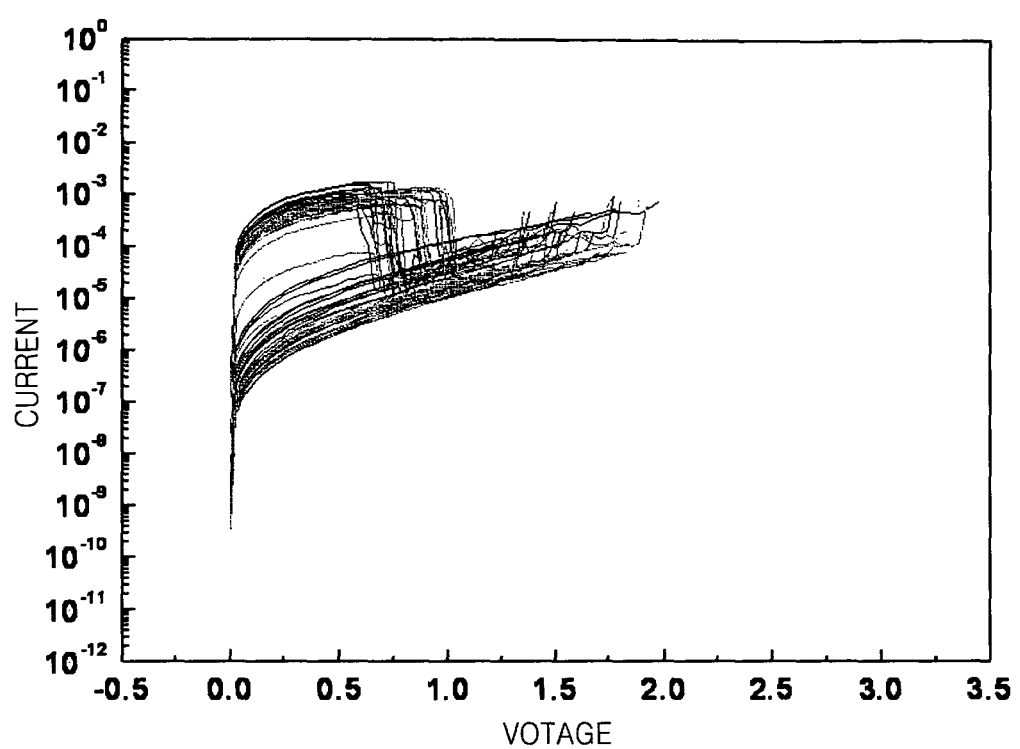

FIGS. 4A and 4B are graphs illustrating the electrical characteristics of two RRAM devices that are formed of Ni oxides doped with Fe at 5 at % and 7 at %, respectively, according to example embodiments. Referring to FIGS. 4A and 4B, a horizontal axis indicates an applied voltage, and a vertical axis indicates a current that flows in a resistive memory layer corresponding to the applied voltage. The amount of current is different between reset and set states and thus the RRAM devices may be used a memory device. An optimum composition range may vary according to the size of a memory cell. Determined by a result of testing, Fe may provide the switching characteristics of the RRAM device when doped between about 3 at % and about 15 at %.

Figure 5A:
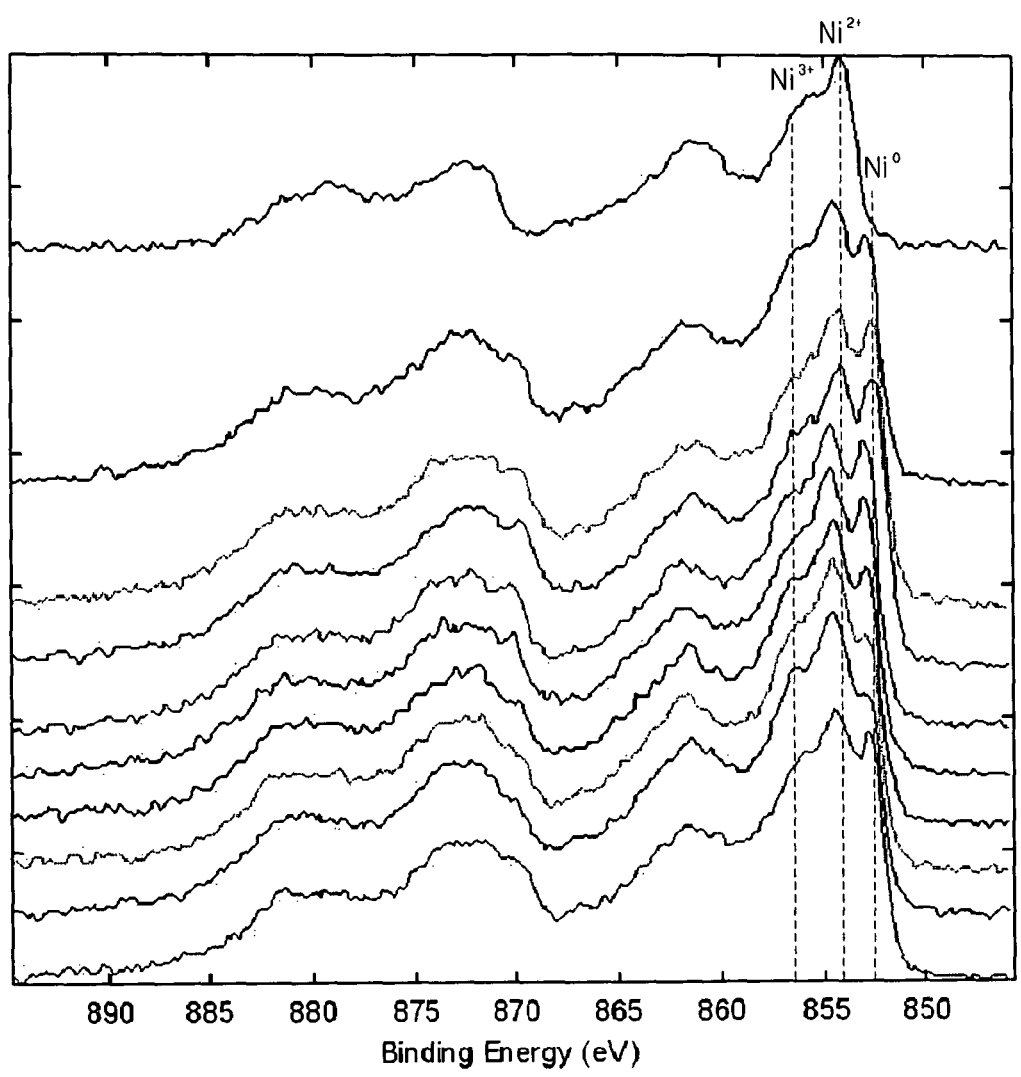
FIGS. 5A and 5B are x-ray photoelectron microscopy (XPS) graphs illustrating an analysis result of the composition of a Ni oxide and a Fe-doped Ni oxide, according to example embodiments.
Figure 5B:
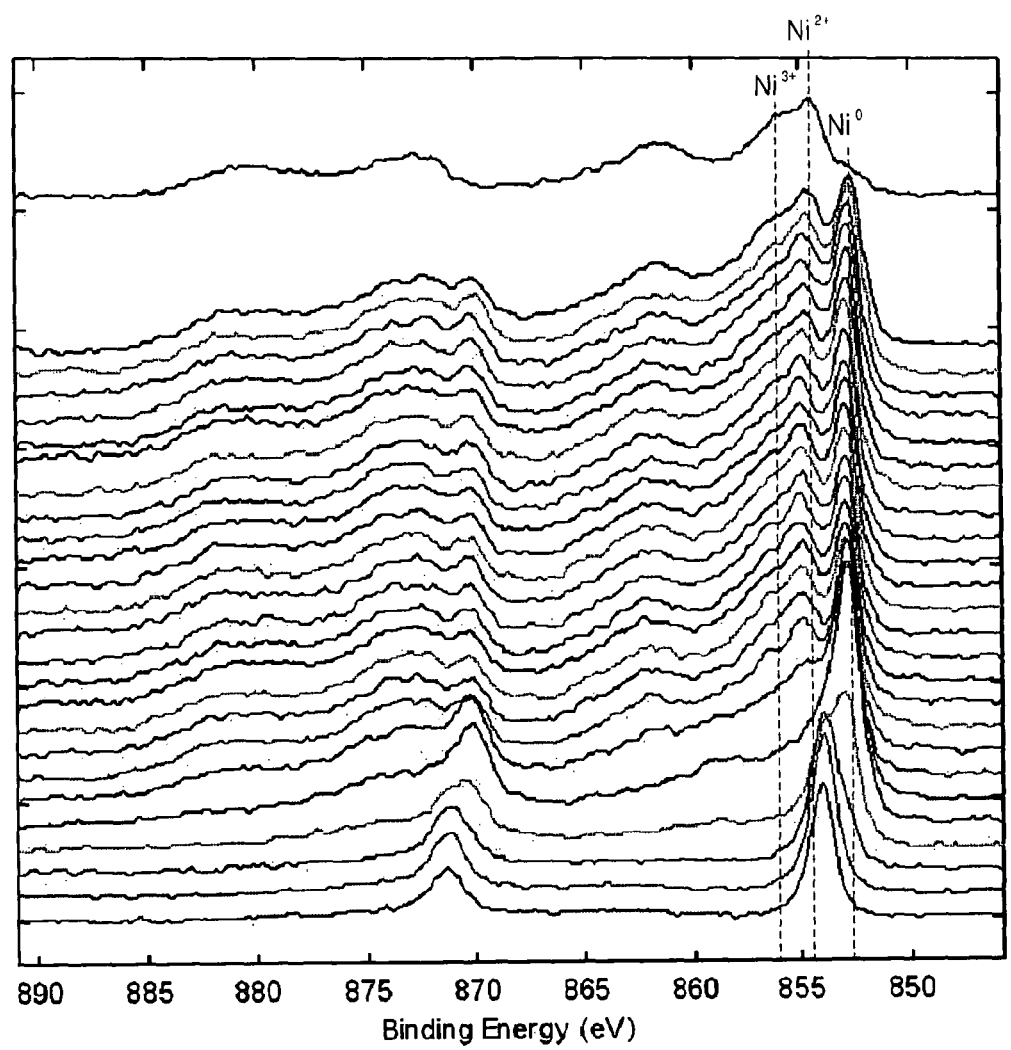
Figure 6A:
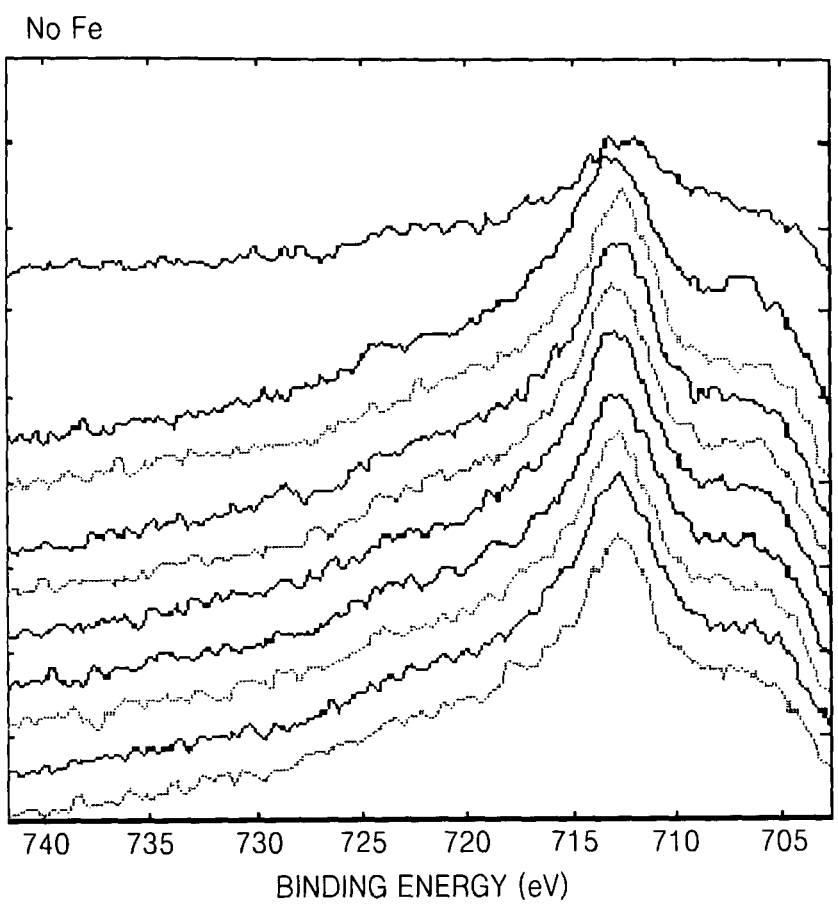
FIGS. 6A through 6D are XPS graphs illustrating Fe that remains in a Ni oxide with respect to the composition of Fe doped in a resistive memory layer, according to example embodiments.
Figure 6B:
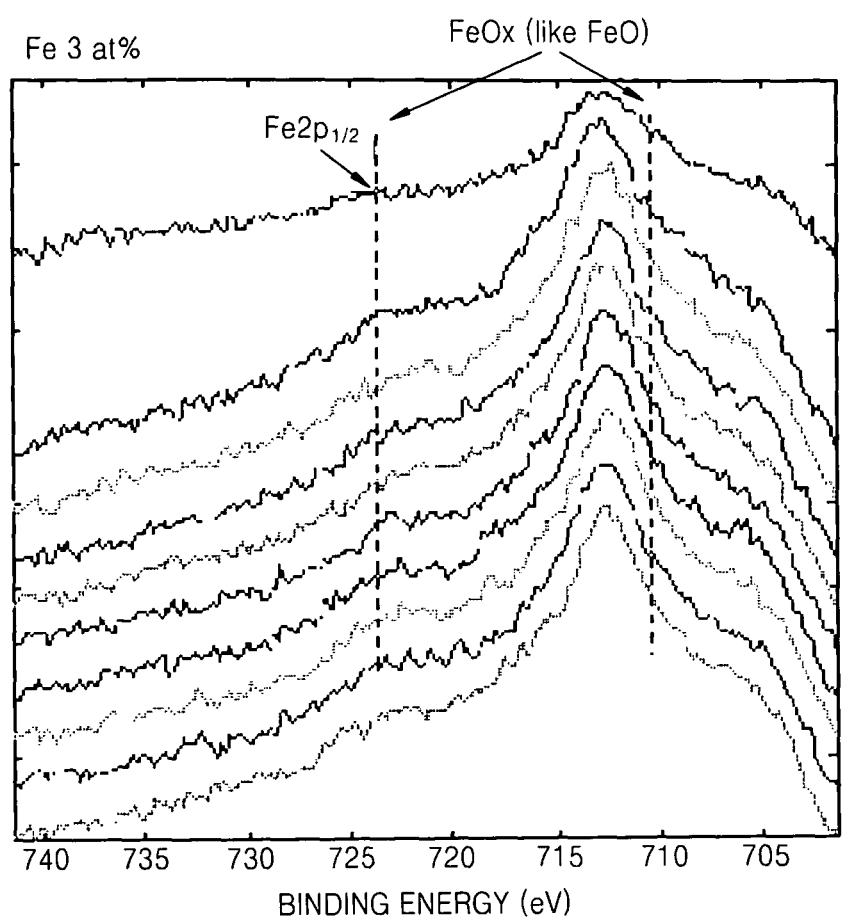
Figure 6C:
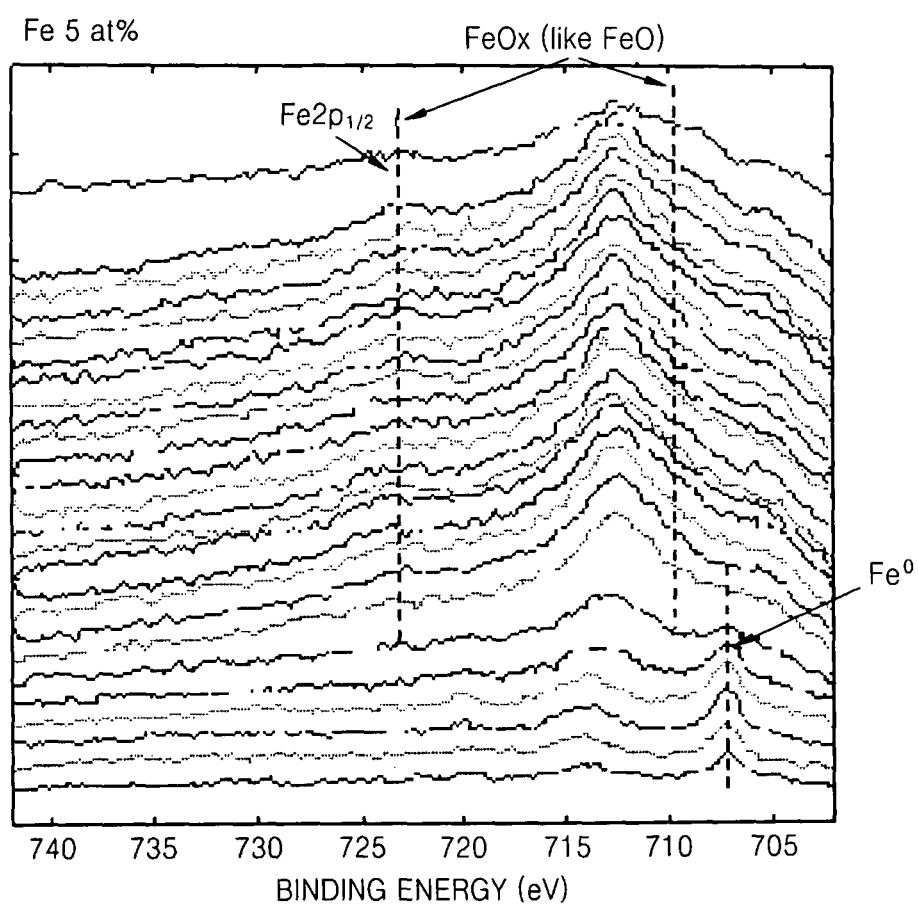
Figure 6D:
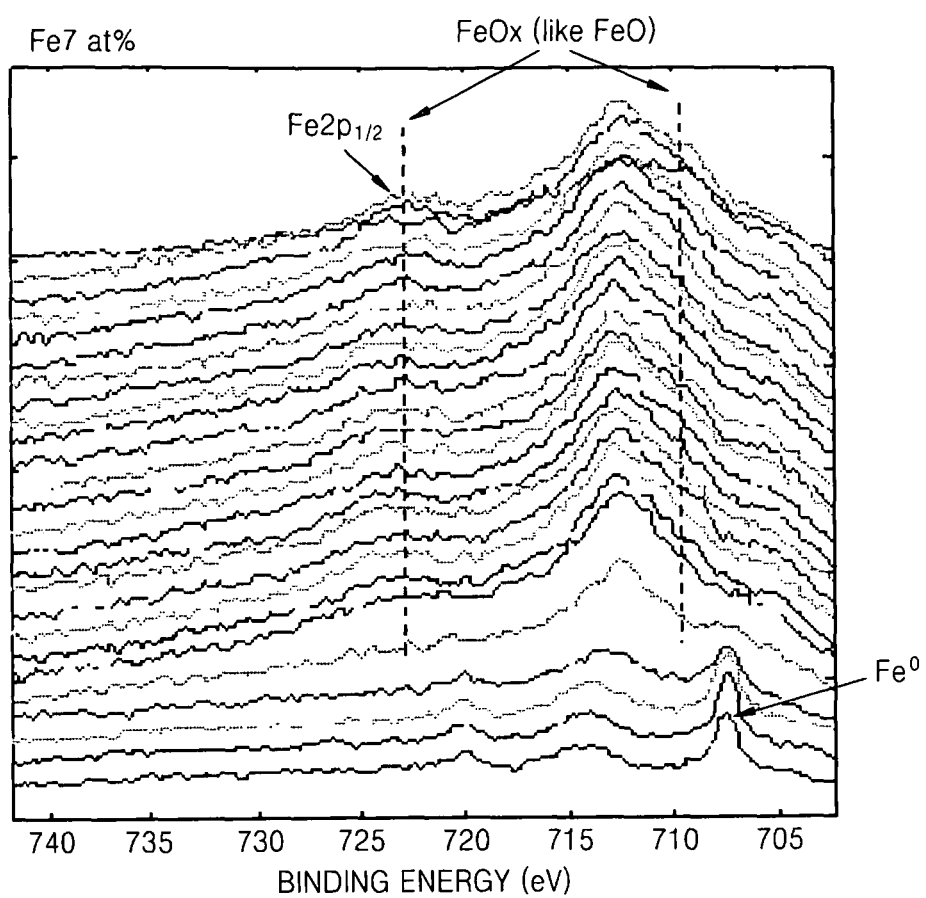

FIGS. 5A and 5B are x-ray photoelectron microscopy (XPS) graphs illustrating an analysis result of the composition of Ni oxide and Fe-doped Ni oxide, according to example embodiments. Referring to FIG. 5A, a resistive memory layer is formed of Ni oxide. Referring to FIG. 5B, a resistive memory layer is formed of Fe-doped Ni oxide.

The XPS graphs show peaks corresponding to $Ni^0$, $Ni^{2+}$, and $Ni^{3+}$. in a region around about 855 eV with reference to FIGS. 5A and 5B. In particular, with reference to FIG. 5B, the peak corresponding to $Ni^0$ is relatively larger than the peaks corresponding to $Ni^{2+}$ and $Ni^{3+}$, since Fe is added to Ni oxide, the Ni oxide reacts with Fe to form Fe oxide and generate Ni.

FIGS. 6A through 6D are XPS graphs illustrating Fe that remains in the Ni oxide with respect to the composition of Fe doped in a resistive memory layer, according to example embodiments. The XPS graphs show results of the resistive memory layer doped with Fe with concentrations of 0 at %, 3 at %, 5 at %, and 7 at %, respectively.

Referring to FIGS. 6A through 6D, the composition of Fe oxide gradually increases in the resistive memory layer according to an increase in the doping amount of Fe, since the Fe oxide is formed by a reaction between Ni oxide and Fe doped in the resistive memory layer.

Figure 7:
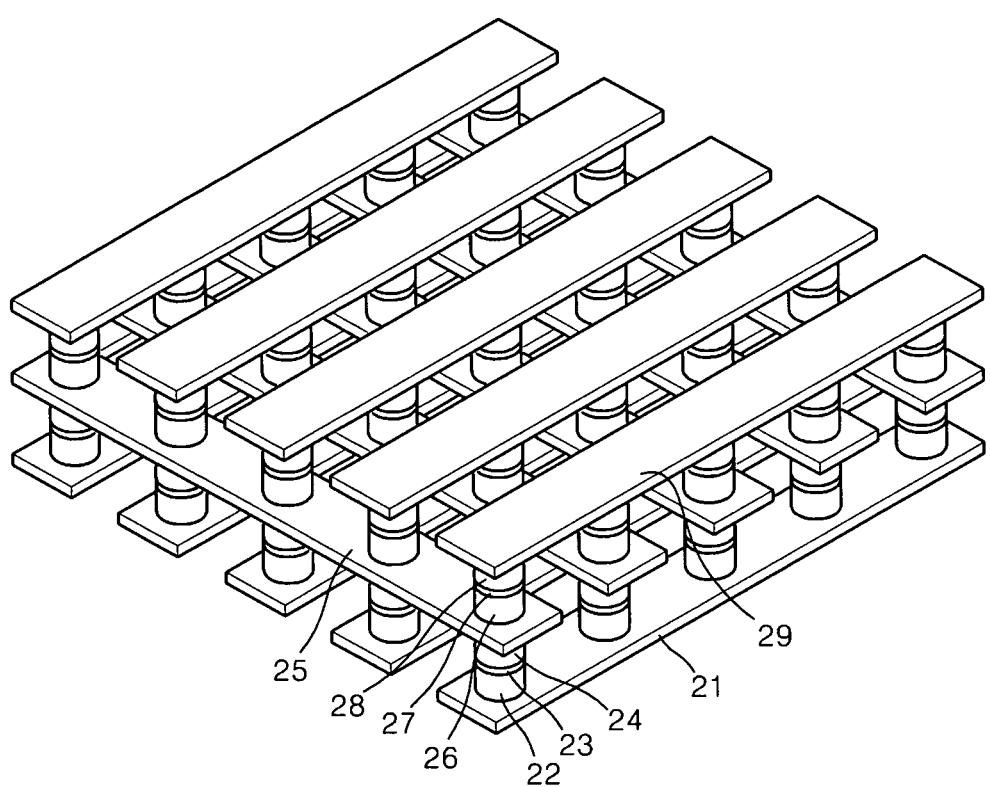
FIG. 7 is a perspective view of an RRAM array having a multi-stack structure, according to example embodiments.

The RRAM device according to example embodiments may have an array structure, for example, a cross point type multi-stack structure. FIG. 7 is a perspective view of an RRAM array having a multi-stack structure according to example embodiments.

Referring to FIG. 7, the RRAM array includes a plurality of first electrode lines 21 formed in a first direction, a plurality of first switch structures 22, a plurality of first intermediate electrodes 23, a plurality of first resistive memory layers 24 on the first electrode lines 21, and a plurality of second electrode lines 25 formed on the first resistive memory layers 24 in a second direction intersecting the first direction. A plurality of second switch structures 26, a plurality of second intermediate electrodes 27, and a plurality of second resistive memory layers 28 are formed on the second electrode lines 25, and a plurality of third electrode lines 29 are formed in the first direction on the second resistive memory layers 28.

Each of the above elements may be formed of the materials described with reference to FIGS. 1A and 1B. The first resistive memory layers 24 and the second resistive memory layers 28 may be formed of Ni oxide doped with Fe, Co, and/or Sn. The doping concentration of Fe, Co and/or Sn in the Ni oxide between may be between about 3 at % and about 15 at %.

As described above, Ni oxide is doped with Fe, thereby improving the memory switching characteristics. In particular, an RRAM device may maintain stable operational characteristics even after multiple switching operations.

As described above, according to example embodiments, since a RRAM device includes a resistive memory layer doped with Fe, the RRAM device and an RRAM array may have improved electrical characteristics such as distribution and may stably operate.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A resistive random access memory (RRAM) device, comprising:
a RRAM stack, including
at least one first electrode;
a switch structure on the at least one first electrode;
an intermediate electrode on the switch structure;
a resistive memory layer on the at least one first electrode, the resistive memory layer including a Ni oxide layer doped with at least one element selected from a group consisting of Fe, Co, and Sn; and
at least one second electrode on the resistive memory layer, wherein
the at least one first electrode is a plurality of first electrodes,
the at least one second electrode is a plurality of second electrodes, and
the resistive memory layer is between the plurality of first electrodes and the plurality of second electrodes.

2. The RRAM device of claim 1, wherein a doping concentration of the at least one element selected from the group consisting of Fe, Co, and Sn in the resistive memory layer is between about 3 at % and about 15 at %.

3. The RRAM device of claim 1, wherein the resistive memory layer is. doped with Fe.

4. The RRAM device of claim 1, wherein a resistance of the resistive memory layer varies according to a voltage applied thereto.

5. The RRAM device of claim 4, wherein the resistive memory layer exhibits at least two resistance states.

6. A resistive random access memory (RRAM) device, comprising:
a RRAM stack, including
a first electrode;
a switch structure on the first electrode;
an intermediate electrode on the switch structure;
a resistive memory layer on the intermediate electrode, the resistive memory layer including a Ni oxide layer doped with at least one element selected from a group consisting of Fe, Co, and Sn; and
a second electrode on the resistive memory layer, wherein
the first electrode is a plurality of first electrodes,
the second electrode is a plurality of second electrodes, and
the resistive memory layer is between the plurality of first electrodes and the plurality of second electrodes.

7. The RRAM device of claim 6, wherein a doping concentration of the at least one element selected from the group consisting of Fe, Co, and Sn in the resistive memory layer is between about 3 at % and about 15 at %.

8. The RRAM device of claim 6, wherein the resistive memory layer is doped with Fe.

9. The RRAM device of claim 6, wherein a resistance of the resistive memory layer varies according to a voltage applied thereto.

10. The RRAM device of claim 9, wherein the resistive memory layer exhibits at least two resistance states.

11. A resistive random access memory (RRAM) array, comprising:
a plurality of first electrode lines in a first direction;
a first switch structure on each of the first electrode lines;
a first intermediate electrode on the first switch structure;
a first resistive memory layer on the first intermediate electrode, the first resistive memory layer including a Ni oxide layer doped with at least one element selected from a group consisting of Fe, Co, and Sn; and
a plurality of second electrode lines on the first resistive memory layer in a second direction, the second direction intersecting the first direction, wherein the first switch structure, the first intermediate electrode, the first resistive memory layer, a portion of each of the first electrode lines, and a portion of each of the second electrode lines are in a same RRAM stack.

12. The RRAM array of claim 11, further comprising:
a second switch structure on the plurality of second electrode lines;
a second intermediate electrode on the second switch structure;
a second resistive memory layer on the second intermediate electrode, the second resistive memory layer including a Ni oxide doped with at least one element selected from the group consisting of Fe, Co, and Sn; and
a plurality of third electrode lines on the second resistive memory layer in the first direction.

13. The RRAM array of claim 11, wherein a doping concentration of the at least one element selected from the group consisting of Fe, Co, and Sn in the first resistive memory layer is between about 3 at % and about 15 at %.

14. The RRAM array of claim 11, wherein the first resistive memory layer is doped with Fe.

15. The RRAM array of claim 11, wherein a resistance of the first resistive memory layer varies according to a voltage applied thereto.

16. The RRAM array of claim 15, wherein the first resistive memory layer exhibits at least two resistance states.

17. The RRAM array of claim 12, wherein a resistance of the second resistive memory layer varies according to a voltage applied thereto.

18. The RRAM array of claim 17, wherein the second resistive memory layer exhibits at least two resistance states.

19. A resistive random access memory (RRAM) device, comprising:
at least one first electrode;
a resistive memory layer including a Ni oxide layer doped with at least one element selected from a group consisting of Fe and Sn, a doping concentration of the at least one element being between about 3% and less than about 15%; and a second electrode on the resistive memory layer.

* * * * *